United States Patent [19]

Kerber

[11] Patent Number: 5,962,901
[45] Date of Patent: *Oct. 5, 1999

[54] SEMICONDUCTOR CONFIGURATION FOR AN INSULATING TRANSISTOR

[75] Inventor: Martin Kerber, München, Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/715,932

[22] Filed: Sep. 19, 1996

[30] Foreign Application Priority Data

Sep. 19, 1995 [DE] Germany .......................... 195 34 784

[51] Int. Cl.⁶ .................. H01L 27/095; H01L 29/47; H01L 29/812; H01L 31/07
[52] U.S. Cl. .......................... 257/371; 275/288; 275/411
[58] Field of Search .......................... 257/288, 411–413, 257/371, 377, 387

[56] References Cited

U.S. PATENT DOCUMENTS

| | | | |
|---|---|---|---|
| 3,724,065 | 4/1973 | Carbajal, III et al. | 257/411 |
| 4,690,730 | 9/1987 | Tang et al. | 257/411 |
| 4,992,394 | 2/1991 | Kostelak, Jr. et al. | |
| 5,164,803 | 11/1992 | Ozaki et al. | 257/372 |
| 5,190,886 | 3/1993 | Asahina | 257/413 |
| 5,214,305 | 5/1993 | Huang et al. | 257/413 |
| 5,237,188 | 8/1993 | Iwai et al. | 257/411 |
| 5,430,323 | 7/1995 | Yamazaki et al. | 257/471 |
| 5,455,444 | 10/1995 | Hsue | 257/413 |
| 5,486,715 | 1/1996 | Zommer | 257/413 |
| 5,581,099 | 12/1996 | Kusaka et al. | 257/222 |
| 5,594,267 | 1/1997 | Ema et al. | 257/368 |
| 5,606,192 | 2/1997 | Harada | 257/412 |
| 5,625,216 | 4/1997 | Miller | 257/387 |

FOREIGN PATENT DOCUMENTS

| | | |
|---|---|---|
| 0 181 501 A2 | 5/1986 | European Pat. Off. . |
| 0 230 648 A2 | 8/1987 | European Pat. Off. . |
| 0 335 074 A2 | 10/1989 | European Pat. Off. . |
| 0 417 715 A1 | 3/1991 | European Pat. Off. . |
| 39 42 648 A1 | 6/1990 | Germany . |
| 42 14 302 A1 | 11/1992 | Germany . |

Primary Examiner—David B. Hardy
Assistant Examiner—Allan R. Wilson
Attorney, Agent, or Firm—Herbert L. Lerner; Laurence A. Greenberg

[57] ABSTRACT

A method for producing a semiconductor configuration, such as a field plate insulating transistor, is suitable for providing mutual insulation of two complementary wells in a substrate. A first insulation layer, a dopable layer and a sacrificial layer are applied on the substrate. A first region of the sacrificial layer is removed to form an edge through the use of a first mask technique, and a first region of the dopable layer which is thereby bared is doped simultaneously with the substrate located beneath, creating the first well. The second well is produced analogously, with the edge serving as an adjustment mark for a requisite second mask technique. It is not until after the doping that a second insulation layer is applied, which is then structured to form the insulating transistor. Advantageously, less energy is required to produce sufficiently deep wells by implantation doping, including beneath the insulating transistor, than if the doping is not carried out until after the application of the second insulation layer.

5 Claims, 2 Drawing Sheets

SEMICONDUCTOR CONFIGURATION FOR AN INSULATING TRANSISTOR

BACKGROUND OF THE INVENTION

Field of the Invention

The invention relates to a semiconductor configuration and a method for its production.

Field plate insulating transistors are semiconductor configurations that serve the purpose of mutual insulation of two adjacent cells in a substrate which are doped with dopant atoms of complementary types. They can be provided as an alternative to so-called LOCOS insulators. The insulating transistors are intended to prevent the occurrence of parasitic MOS transistors between the wells. To that end, the insulating transistors are disposed between the wells and, above the substrate, over a thin gate oxide, they have a so-called field plate, which includes a dopable layer and extends partway over both wells. Regions of the field plate that are located above one of the wells are doped with charge carriers of the same type as the particular wells located below and have the same potential as that well. In order to insulate the field plate from conductor tracks extending above it, the insulating transistors have a thick field oxide layer above the field plate.

The production of a field plate insulating transistor can be carried out in such a way that first the wells are made in the substrate, and then the necessary layers for producing the insulating transistor are formed.

German Published, Non-Prosecuted Patent Application DE 195 26 568 A1 describes a method for producing a field plate insulating transistor in which the doping of a well and of the corresponding field plate region is carried out in one step. The dopant concentration of that field plate region is then equivalent to that of the well located beneath and therefore is relatively slight, so that the field plate can be made in one piece. The aforementioned application describes the fact that to produce the field plate insulating transistor, the gate oxide layer, the field plate layer and the field oxide layer are first applied and then subsequently structured. At the same time one of the wells and the field plate region located above it are doped over that, by ion implantation. The well regions located below the insulating transistor are doped through the field oxide layer. That method therefore has the disadvantage of requiring very high energies to carry out the implantation doping, in order to achieve adequately deep doping of the wells even below the field plate (and therefore underneath the thick field oxide layer). However, an adequate well depth is necessary to prevent the electric strength of the configuration from being too slight.

SUMMARY OF THE INVENTION

It is accordingly an object of the invention to provide a semiconductor configuration, for instance an advantageous field plate insulating transistor, and an improved method for producing the semiconductor configuration, which overcome the hereinafore-mentioned disadvantages of the heretofore-known devices and methods of this general type.

With the foregoing and other objects in view there is provided, in accordance with the invention, a semiconductor configuration, comprising a sacrificial layer having an edge for adjusting a mask technique during a production process of the semiconductor configuration; intended electrical functions of the semiconductor configuration being independent of the sacrificial layer.

In accordance with another feature of the invention, there is provided a substrate beneath the sacrificial layer, the sacrificial layer being in the form of a land, and doped wells of opposed conduction types each being disposed on a respective side of the land in the substrate.

With the objects of the invention in view there is also provided a method for producing a semiconductor configuration, which comprises applying a first insulation layer, a dopable layer and a sacrificial layer in succession on a substrate; removing a first region of the sacrificial layer with a first mask technique to produce an edge on the sacrificial layer and a bared first region of the dopable layer; doping the bared first region of the dopable layer and the substrate located beneath the bared first region of the dopable layer with a first type of charge carrier to create a first well in the substrate; removing a second region of the sacrificial layer with a second mask technique while using the edge of the sacrificial layer to adjust the second mask technique and producing a bared second region of the dopable layer; and doping the bared second region of the dopable layer and the substrate beneath the bared second region of the dopable layer with a second type of charge carrier to create a second well in the substrate.

According to the invention, a sacrificial layer that is not present in the prior art is provided. By removing a first region of the sacrificial layer using a first mask technique, an edge of the sacrificial layer is created that is used as an adjustment point for carrying out a second mask technique.

The invention is applicable to all semiconductor configurations in whose production no adjustment mark that is formed by structures required for an intended electrical function of the finished semiconductor configuration are available for the performance of process steps. Conversely, the sacrificial layer according to the invention is not necessary for the electrical function of the semiconductor configuration and accordingly it is not provided by circuitry and also does not act to insulate various layers from one another. Instead, the finished semiconductor configuration functions regardless of the presence of the sacrificial layer. This sacrificial layer is necessary solely for the production of the semiconductor configuration and makes it possible to carry out the necessary production steps in the desired order. The invention makes it possible to carry out production steps, by which structures that are necessary for the electrical function are formed, in an order which would not be feasible in that order, because of the lack of suitable adjustment marks in these structures, without the sacrificial layer that is unimportant to the electrical function.

Through the use of the invention it is possible, in the case in which the semiconductor configuration is a field plate insulating transistor, to dope the dopable layer and the wells located beneath it even before a second insulation layer (for instance, a field oxide layer) is applied above the dopable layer (or field plate layer). The sacrificial layer is necessary to enable adjustment of the second mask technique relative to the first mask technique, or adjustment of the second well and the second region of the dopable layer relative to the first well and to the first region of the dopable layer.

Since the doping of the wells is carried out before the second insulation layer is applied, and consequently the doping takes place only through the thin, first insulation layer and the dopable layer, an implantation doping can be carried out with relatively low energies as compared with the prior art described, so that an adequate well depth is attained everywhere even below the dopable layer. When the method of the invention is employed, the well depths inside and outside the semiconductor configuration are virtually the same, so that a homogeneous lateral dopant distribution is attained.

Conversely, in the prior art described, the doping is effected after the complete insulating transistor (which already has the second insulation layer) has been structured through the use of a mask technique. In order to adjust the ensuing two mask techniques to make the wells, the then already-structured insulating transistor is used in the prior art. The doping takes place through the thick second insulating layer, which prevents a homogeneous lateral dopant distribution underneath the field plate insulating transistor.

In accordance with another mode of the invention, there is provided a method which comprises preserving a land of the sacrificial layer between the first and second regions of the sacrificial layer, when performing the second mask technique.

In accordance with a further mode of the invention, there is provided a method which comprises applying a second insulation layer having a protuberance therein above the land.

In accordance with an added mode of the invention, there is provided a method which comprises structuring the semiconductor configuration with a third mask technique, and removing the first insulation layer, the dopable layer and the second insulation layer from a surface of the substrate outside a region above which the semiconductor configuration is intended to extend, with the protuberance serving to adjust the third mask technique.

In accordance with an additional mode of the invention, there is provided a method which comprises applying a silicon layer as the dopable layer.

In accordance with a concomitant mode of the invention, there is provided a method which comprises applying an oxide layer as the sacrificial layer.

If a plurality of identical semiconductor configurations according to the invention are to be produced on one substrate and are located in the field of view of a photographic exposure device, then it suffices to use only one mask simultaneously for all of the semiconductor configurations in each production step. It is then possible, for adjusting the second mask technique, to use only two of the edges produced by the first mask technique (two adjustment marks are always necessary to adjust a single plane). It is also then sufficient to provide a land according to the invention in the sacrificial layer, for forming the protuberance in the second insulation layer to adjust the third mask technique, in only two of the semiconductor configurations per field of view of the photographic exposure device. Where there is no land, the wells can be immediately adjacent one another and need not be spaced apart.

Other features which are considered as characteristic for the invention are set forth in the appended claims.

Although the invention is illustrated and described herein as embodied in a semiconductor configuration and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
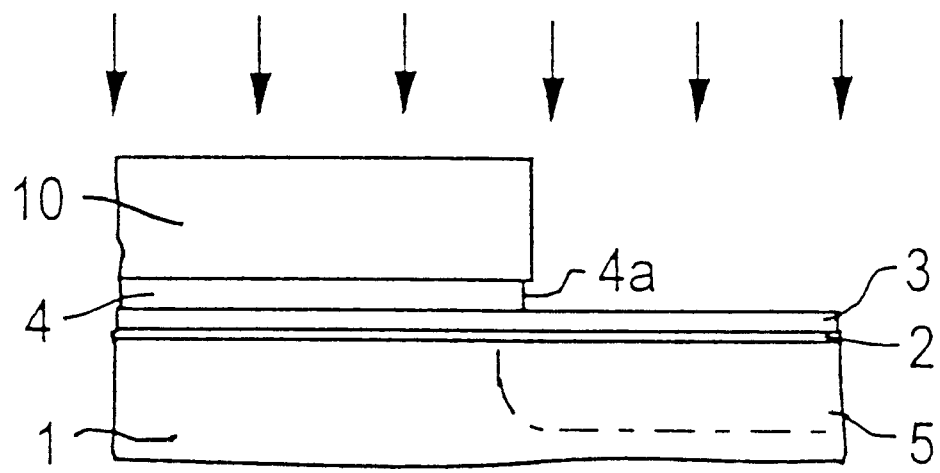
FIGS. 1–4 are fragmentary, diagrammatic, sectional views illustrating only those methods steps of one exemplary embodiment of the production of a semiconductor configuration that is a field plate insulating transistor, which are essential to the invention.

Referring now to the figures of the drawings in detail and first, particularly, to FIG. 1 thereof, there is seen a first insulation layer 2 for forming a gate oxide of a semiconductor configuration or field plate insulating transistor that is applied on a substrate 1 which, for instance, substantially contains silicon. A dopable layer 3 (in this case a field plate layer), for instance of silicon, and a sacrificial layer 4, for instance of an oxide (such as TEOS), are formed over the first insulation layer 2. In a first masking technique, a portion of the sacrificial layer 4 is then covered by a first mask 10, and a first region of the sacrificial layer 4 not covered by the mask 10 is removed, for instance by etching. In this way, a first region of the dopable region 3 located beneath the sacrificial layer, is laid bare. Next, through the use of a first doping (for instance by ion implantation), the first region of the dopable layer 3 and a portion of the substrate 1 located beneath it are doped with a first type of charge carrier, thus creating a first well 5 in the substrate 1.

Figure 2:
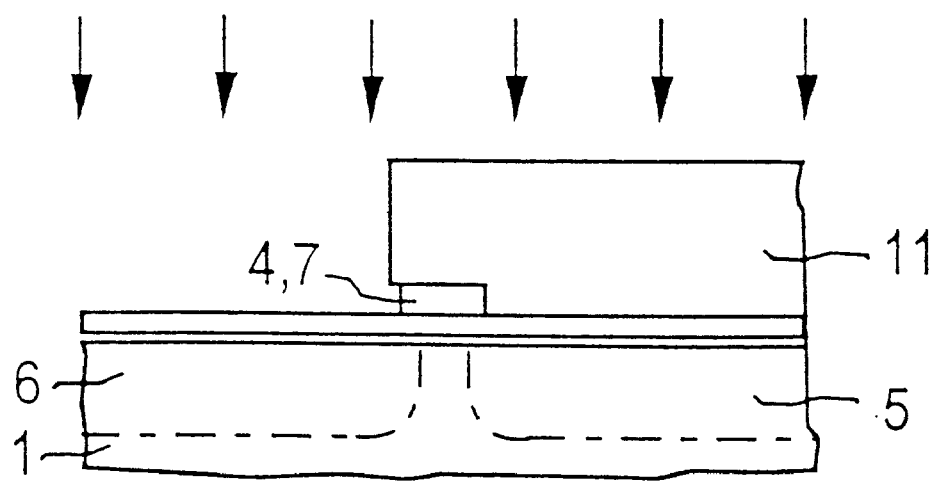

As is illustrated in FIG. 2, in order to produce a second well 6 with a conduction type complementary to that of the first well 5, the first region of the dopable layer 3, which has already been doped in the first masking technique using the first mask 10, is covered in a second masking technique with a second mask 11. In this operation, an edge 4a of the sacrificial layer 4, which is visible in FIG. 1 and has been created by the removal of the first region of the sacrificial layer 4, serves to adjust the second mask 11. The second mask 11 shown in FIG. 2 covered not only the first region of the dopable layer 3 but also an adjacent portion of the sacrificial layer 4, which at this location has not yet been removed, and which has the form of a land 7 once the steps described below have been performed. Analogously to the procedure of FIG. 1, a second region of the sacrificial layer 4 that is not covered by the second mask 11 is then removed. As a result, a second region of the dopable layer 3, which is located beneath it, is laid bare. That region, analogously to FIG. 1, is doped simultaneously with the portion of the substrate 1 located beneath it, with charge carriers of a second conduction type. This produces the second well 6 in the substrate 1.

Figure 3:
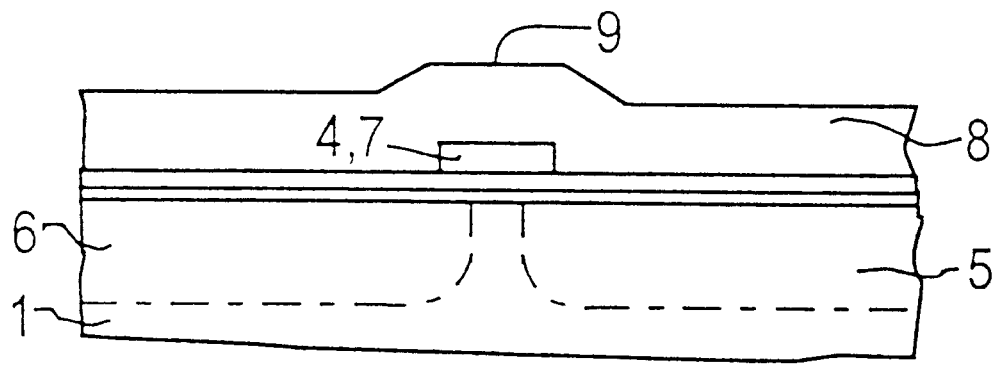

Referring to FIG. 3, it is seen that next, a full-surface second insulation layer 8 is applied, which, for example, may be a field oxide layer. Due to the land 7 that is present in this embodiment of the invention, a protuberance 9 forms above the land 7 in the second insulation layer 8 when this second insulation layer 8, which has a virtually constant thickness, is deposited.

Figure 4:
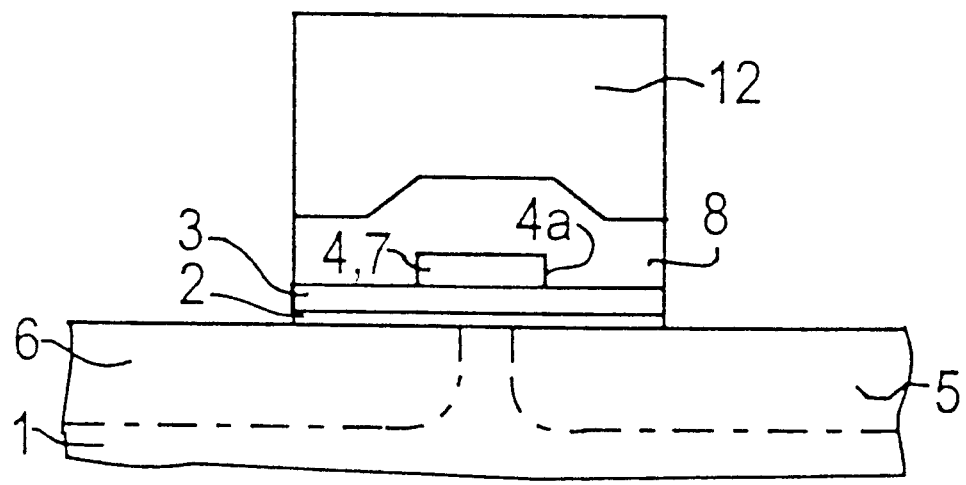

FIG. 4 shows that the protuberance 9 finally serves to adjust a third mask 12 used to structure the insulating transistor. The third mask covers the portion of the second insulation layer 8 where the insulating transistor is to be formed. The regions of the first insulation layer 2, the dopable layer 3, and the second insulation layer 8 that are not covered by the third mask 12 can then be removed selectively down to the substrate 1, for instance by anisotropic etching.

The variously doped regions of the dopable layer 3 are intended to be connected to the same respective potentials as the wells 5, 6 located beneath them during the operation of an integrated circuit of which the insulating transistor is a component. In order to accomplish this, it is advantageous to create an electrical connection between each of the two wells 5, 6 and the respective regions of the dopable layer 3 located above them, after the production of the insulating transistor. This can be carried out by the structuring shown in FIG. 4. Methods for producing such contacts are familiar to one skilled in the art.

I claim:

1. A semiconductor configuration, comprising:

a semiconductor substrate;

a first well and a second well disposed adjacent to each other in said semiconductor substrate, said first well doped with dopant atoms of a first conductivity type, said second well doped with dopant atoms of a second conductivity type which is opposite to said first conductivity type;

a first insulation layer disposed on said semiconductor substrate extending partially over said first well and extending partially over said second well;

a field plate layer disposed on said first insulation layer and extending partially over said first well and extending partially over said second well;

a sacrificial layer disposed on said field plate layer, said sacrificial layer having an edge, said edge adjusting a mask technique during a production process of the semiconductor configuration whereby electrical functions of the semiconductor configuration are independent of said sacrificial layer; and a second insulation layer disposed on said field plate layer and said sacrificial layer causing a protuberance in said second insulation layer overlying said sacrificial layer.

2. The semiconductor configuration according to claim 1, wherein said first insulation layer is an oxide layer.

3. The semiconductor configuration according to claim 1, wherein said second insulation layer is a field oxide layer.

4. The semiconductor configuration according to claim 1, wherein said field plate layer is a silicon layer.

5. The semiconductor configuration according to claim 1, wherein said sacrificial layer is an oxide layer.

* * * * *